US011410071B2

(12) United States Patent
Babbush

(10) Patent No.: US 11,410,071 B2
(45) Date of Patent: Aug. 9, 2022

(54) FERMIONIC SIMULATION GATES

(71) Applicant: Google LLC, Mountain View, CA (US)

(72) Inventor: Ryan Babbush, Venice, CA (US)

(73) Assignee: Google LLC, Mountain View, CA (US)

(*) Notice: Subject to any disclaimer, the term of this patent is extended or adjusted under 35 U.S.C. 154(b) by 157 days.

(21) Appl. No.: 16/753,070

(22) PCT Filed: Oct. 2, 2017

(86) PCT No.: PCT/US2017/054714
§ 371 (c)(1),
(2) Date: Apr. 2, 2020

(87) PCT Pub. No.: WO2019/070228
PCT Pub. Date: Apr. 11, 2019

(65) Prior Publication Data
US 2020/0293937 A1     Sep. 17, 2020

(51) Int. Cl.
*G11C 11/04*     (2006.01)
*G06N 10/00*     (2022.01)
*H01L 29/66*     (2006.01)

(52) U.S. Cl.
CPC ....... *G06N 10/00* (2019.01); *H01L 29/66977* (2013.01)

(58) Field of Classification Search
CPC .................. G06N 10/00; H01L 29/66977
See application file for complete search history.

(56) References Cited

U.S. PATENT DOCUMENTS

| 10,311,370 | B2* | 6/2019 | Bravyi | G06N 10/00 |
| 2017/0351967 | A1* | 12/2017 | Babbush | G06N 20/00 |
| 2018/0322409 | A1* | 11/2018 | Barends | G06F 17/16 |
| 2019/0156239 | A1* | 5/2019 | Martinis | G06N 10/00 |

FOREIGN PATENT DOCUMENTS

WO    WO 2015/069625    5/2015

OTHER PUBLICATIONS

CA Office Action in Canadian Application No. 3,078,307, dated May 31, 2021, 3 pages.
PCT International Preliminary Report on Patentability in International Application No. PCT/US2017/054714, dated Apr. 7, 2020, 12 pages.
PCT International Search Report and Written Opinion in International Application No. PCT/US2017/054714, dated Jun. 27, 2018, 19 pages.

(Continued)

*Primary Examiner* — Pho M Luu
(74) *Attorney, Agent, or Firm* — Fish & Richardson P.C.

(57) ABSTRACT

Methods, systems, and apparatus for simulating a physical system. A Hamiltonian describing the physical system is transformed into a qubit Hamiltonian describing a corresponding system of qubits, the qubit Hamiltonian comprising a transformed kinetic energy operator. The evolution of the system of qubits under the qubit Hamiltonian is simulated, including simulating the evolution of the system of qubits under the transformed kinetic energy operator by applying a fermionic swap network to the system of qubits. The simulated evolution of the system of qubits under the qubit Hamiltonian is used to determine properties of the physical system.

22 Claims, 9 Drawing Sheets

(56) References Cited

OTHER PUBLICATIONS

Warren, "Gates for Adiabatic Quantum Computing" arXiv, Aug. 2014, 19 pages.
Whitfield et al, "Local spin operators for fermion simulations" arXiv, May 31, 2016, 5 pages.
AU Office Action in Australian Application No. 2017434905, dated Oct. 28, 2020, 4 pages.
Babush et al., "Low depth quantum simulation of electronic structure" arXiv, 2017, 41 pages.
Extended European Search Report in European Appln. No. 21215311.8, dated May 9, 2022, 15 pages.

* cited by examiner

| Canonical Ordering | $\frac{1}{2}(X_1X_2 + Y_1Y_2)$ | $\frac{1}{2}(X_2X_3 + Y_2Y_3)$ | $\frac{1}{2}(X_3X_4 + Y_3Y_4)$ | $\frac{1}{2}(X_4X_5 + Y_4Y_5)$ |
|---|---|---|---|---|
| φ1φ2 φ3φ4 φ5 | $a_1^\dagger a_2 + a_2^\dagger a_1$ | | | |
| φ2 φ1φ4 φ3φ5 | | $a_1^\dagger a_4 + a_4^\dagger a_1$ | $a_3^\dagger a_4 + a_4^\dagger a_3$ | |
| φ2φ4 φ1φ5 φ3 | $a_2^\dagger a_4 + a_4^\dagger a_2$ | | $a_1^\dagger a_5 + a_5^\dagger a_1$ | $a_3^\dagger a_5 + a_5^\dagger a_3$ |
| φ4 φ2φ5 φ1φ3 | | $a_2^\dagger a_5 + a_5^\dagger a_2$ | | |
| φ4φ5 φ2φ3 φ1 | $a_4^\dagger a_5 + a_5^\dagger a_4$ | | $a_2^\dagger a_3 + a_3^\dagger a_2$ | $a_1^\dagger a_3 + a_3^\dagger a_1$ |

FIG. 6

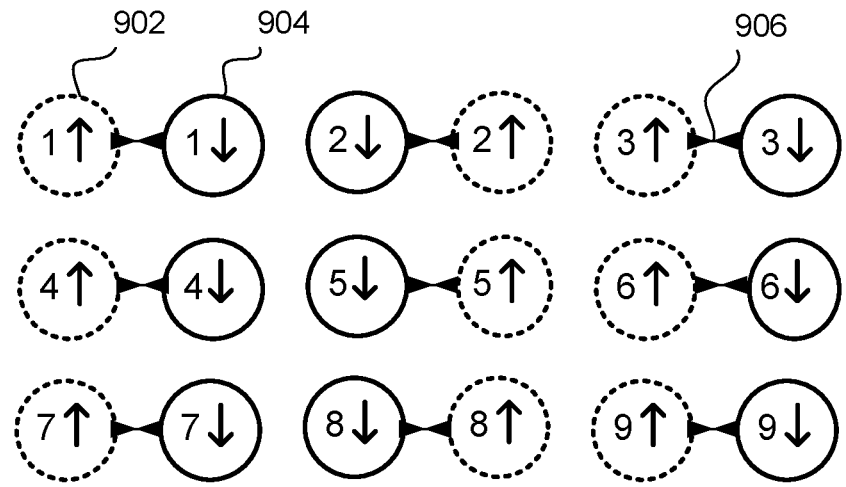
Left Stagger U$_L$
900a
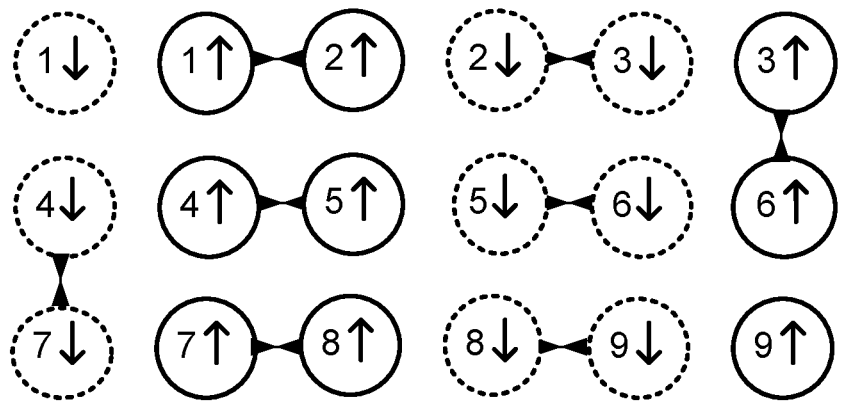
Right Stagger U$_R$
900b
FIG. 9

FERMIONIC SIMULATION GATES

CROSS-REFERENCE TO RELATED APPLICATION

This application is a National Stage Application under 35 U.S.C. § 371 and claims the benefit of International Application No. PCT/US2017/054714, filed Oct. 2, 2017. The disclosure of the foregoing application is hereby incorporated by reference in its entirety.

BACKGROUND

This specification relates to quantum computing.

Quantum simulators are devices designed to provide information and insights about physical systems or devices. Quantum simulators enable physical systems that are difficult to study in a laboratory or impossible to model using a classical processor to be simulated.

SUMMARY

This specification describes methods and systems for implementing fermionic simulation quantum logic gates.

In general, one innovative aspect of the subject matter described in this specification can be implemented in a method for simulating a physical system, the method including transforming a Hamiltonian describing the physical system into a qubit Hamiltonian describing a corresponding system of qubits, the qubit Hamiltonian comprising a transformed kinetic energy operator; simulating evolution of the system of qubits under the qubit Hamiltonian, comprising simulating the evolution of the system of qubits under the transformed kinetic energy operator by applying a fermionic swap network to the system of qubits; and using the simulated evolution of the system of qubits under the qubit Hamiltonian to determine properties of the physical system.

Other implementations of this aspect include corresponding classical or quantum computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the fermionic swap network comprises a quantum circuit comprising multiple layers of fermionic swap gates.

In some implementations transforming the Hamiltonian describing the physical system into the corresponding qubit Hamiltonian comprises applying the Jordan-Wigner transform.

In some implementations the qubits in the system of qubits are indexed according to a canonical ordering, and wherein simulating the evolution of the system of qubits under the transformed kinetic energy operator using the fermionic swap network comprises sequentially applying each of the multiple layers of fermionic swap gates to the system of qubits to change the canonical ordering of the qubits until the canonical ordering is reversed and each index has been adjacent to all others once.

In some implementations the transformed kinetic energy operator comprises one or more operators that act on multiple non-adjacent qubits and wherein sequentially applying each of the multiple layers of fermionic swap gates to the system of qubits maps the one or more operators that act on multiple non-adjacent qubits to operators that act on two neighboring qubits.

In some implementations the one or more operators that act on multiple non-adjacent qubits comprise operators of the form $X_p Z_{p+1} Z_{p+2} \ldots Z_{q-1} X_q$ and $Y_p Z_{p+1} Z_{p+2} \ldots Z_{q-1} Y_q$, with $X_p$ representing a Pauli-X operator applied to qubit p, $Y_p$ representing a Pauli-Y operator applied to qubit p, and $Z_p$ representing a Pauli-Z operator applied to qubit p, and wherein the operators that act on two neighboring qubits comprise operators of the form $X_p X_{p+1}$ and $Y_p Y_{p+1}$.

In some implementations simulating the evolution of the system of qubits under the transformed kinetic energy operator using the fermionic swap network further comprises: interleaving gates for simulating the evolution of the system of qubits under the operators that act on two neighboring qubits between the layers of the fermionic swap network; and applying the interleaved gates when simulating the evolution of the system of qubits.

In some implementations (i) the qubit Hamiltonian further comprises a transformed interaction term comprising operators that act on non-adjacent qubits in the system of qubits, and (ii) simulating the evolution of the system of qubits under the qubit Hamiltonian further comprises simulating the evolution of the system of qubits under the transformed interaction term using the fermionic swap network, comprising: interleaving gates for simulating the evolution of the system of qubits under the operators in the transformed interaction term that act on neighboring qubits between the layers of the fermionic swap network.

In some implementations the transformed interaction term comprises operators of the form $(\Pi - Z_p - Z_{p+1} + Z_p Z_{p+1})$ where $Z_p$ represents a Pauli-Z operator applied to qubit p.

In some implementations simulating evolution of the system of qubits under the qubit Hamiltonian using the fermionic swap network comprises applying a network of fermionic simulation gates to the system of qubits, the fermionic simulation gates being configured to approximately simultaneously (i) simulate the evolution of the system of qubits under the operator $X_p X_{p+1} + Y_p Y_{p+1}$ for a time $\phi$, (ii) simulate evolution of the system of qubits under the operator $Z_p Z_{p+1}$ for a time $\theta$, and (iii) apply a fermionic swap gate to the two modes.

In some implementations N choose 2 fermionic simulation gates are sufficient to implement a Trotter step of evolution, where N represents the number of qubits in the system of qubits.

In some implementations the fermionic simulation gate is given by $$\mathcal{F}(\theta, \phi) = \exp\left(-i\left[\frac{\pi}{4}(Z_p + Z_{p+1}) + \left(\phi + \frac{\pi}{4}\right)(X_p X_{p+1} + Y_p Y_{p+1}) + \theta Z_p Z_{p+1} - \frac{\pi}{2}\right]\right).$$

In some implementations simulating evolution of the system of qubits under the qubit Hamiltonian further comprises applying single qubit rotations to the system of qubits to simulate the single qubit operators in the interaction term.

In some implementations (i) the qubit Hamiltonian further comprises a transformed external potential comprising operators that act on single qubits in the system of qubits, and (ii) simulating evolution of the system of qubits under the qubit Hamiltonian further comprises simulating the evolution of the system of qubits under the transformed external potential, comprising applying single qubit rotations to the system of qubits.

In some implementations sequentially applying each of the multiple layers of fermionic swap gates to the system of qubits to change the canonical ordering of the qubits comprises: indexing the qubits by the canonical ordering from 1 to N; sequentially applying: fermionic swap gates between odd numbered qubits and even numbered qubits to the right; and fermionic swap gates between even numbered qubits and odd numbered qubits to the right.

In some implementations the physical system comprises a system of electrons and wherein the total number of applied layers comprises N applied layers, with N representing the number of orbitals in the system of electrons and the number of qubits in the system of qubits.

In some implementations a fermionic swap gate acting on qubit p and qubit q=p+1 is given by $$f_{swap} = JordanWigner[f_{swap}^{p,q}] = \begin{pmatrix} 1 & 0 & 0 & 0 \\ 0 & 0 & 1 & 0 \\ 0 & 1 & 0 & 0 \\ 0 & 0 & 0 & -1 \end{pmatrix}.$$

In some implementations the qubit Hamiltonian describes a system of qubits that interact via linear nearest neighbor couplings.

In some implementations the physical system comprises a system of electrons.

In some implementations the system of electrons represent a chemical or material, and wherein using the simulated evolution of the system of qubits under the qubit Hamiltonian to determine properties of the system of electrons comprises using the simulated evolution of the system of qubits under the qubit Hamiltonian to determined properties of the chemical or material.

In some implementations the physical system is described by a two-dimensional Hubbard model.

The subject matter described in this specification can be implemented in particular ways so as to realize one or more of the following advantages.

A system for simulating electronic structure Hamiltonians using fermionic simulation gates, as described in this specification, may achieve increased computational efficiency and require fewer computational resources compared to other systems for simulating electronic structure Hamiltonians.

For example, the systems described in this specification combine the simulation of the kinetic and interaction terms of an electronic structure Hamiltonian into a single swap network. Therefore, unlike other systems for simulating electronic structure Hamiltonians, the systems described in this specification may avoid using complex procedures with significant constant overhead, e.g., the fast fermionic Fourier transform.

In addition, the systems described in this specification construct and implement a swap network that uses N layers of fermionic swap gates, with N representing a number of qubits in the system, and requires only linear nearest neighbor connectivity between qubits. This provides asymptotical improvements over other systems for simulating electronic structure Hamiltonians that require that the qubit connectivity graph be a square grid and that use a higher number, e.g., $$2N + \sqrt{N}\left(1 + \frac{1}{\sqrt{2}}\right) - 2,$$

of fermionic swap gates.

Furthermore, the swap network used by the system may implement $n_p n_q$ terms in an electronic structure Hamiltonian without restrictive recursive schemes.

As another example, the systems described in this specification require fewer quantum logic gates and require only $N^2/2$ entangling two-qubit operations to simulate systems of electrons—saturating a lower-bound on the number of two-qubit entangling operations required to implement an explicit Trotter step of evolution.

In addition, a system for simulating electronic structure Hamiltonians, as described in this specification, simulates electronic Hamiltonians in linear depth.

A system for simulating electronic structure Hamiltonians, as described in this specification, may be applied using commercially available superconducting platforms with a gate set of single qubit rotations and CZ gates on a linear array, e.g., simulating jellium with a circuit depth of 385 gates.

Electronic structure Hamiltonian simulations are relevant to a variety of industrial applications. For example, simulating electronic structure Hamiltonians may form an essential part of developing new batteries, solar cells, catalysts, or superconductors. The techniques for simulating electronic structure Hamiltonians described in this specification may be used to improve and increase the efficiency of such development processes.

Fermionic simulation gates, as described in this specification, can be applied to various other settings in addition to electronic structure Hamiltonian simulations. For example, the techniques described in this specification can be applied to the Hubbard model to simulate Trotter steps in $O(\sqrt{N})$ depth, or can be used to implement variational algorithms or phase estimation algorithms.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 6 is a table showing an example mapping of qubit operators to kinetic energy operator terms at multiple layers of fermionic swap gates.

FIG. 9 is an illustration 900 of an example sequence of fermionic swaps.

Like reference numbers and designations in the various drawings indicate like elements.

DETAILED DESCRIPTION

Figure 1:
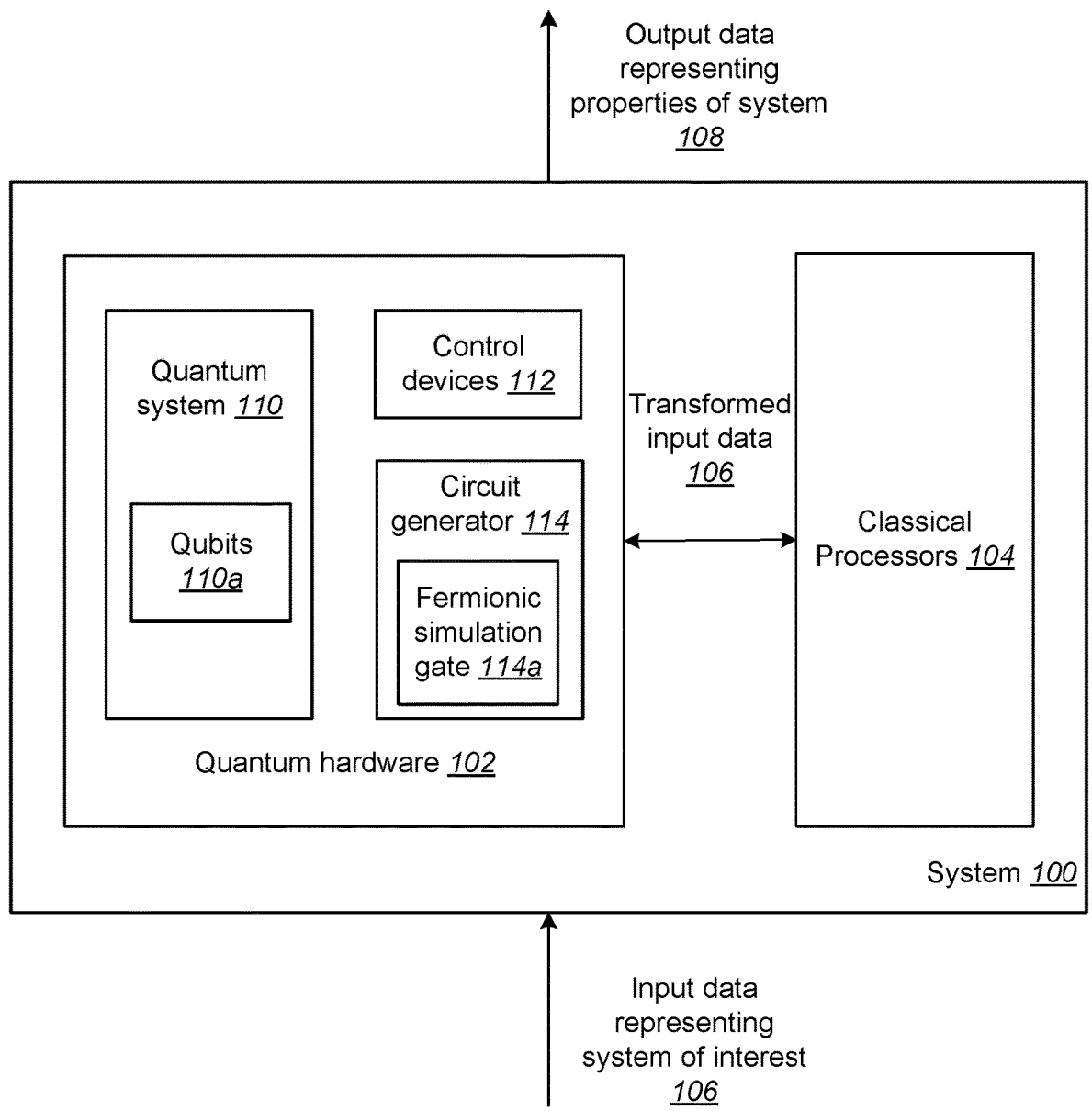
FIG. 1 depicts an example device for performing quantum simulations using fermionic simulation gates.

This specification describes methods and systems for implementing fermionic simulation gates. One application of fermionic simulation gates is simulating the time evolution of an electronic structure Hamiltonian.

The electronic structure Hamiltonian may be expressed in the plane wave dual basis and is given by equation (1) below.

$$H = \sum_{v,p,q,\sigma} \frac{k_v^2 \cos(k_v \cdot r_q - k_v \cdot r_p)}{2N} a_{p,\sigma}^\dagger a_{q,\sigma} - \sum_{\substack{p,\sigma \\ j,v \neq 0}} \frac{4\pi \zeta_j \cos(k_v \cdot R_j - k_v \cdot r_p)}{\Omega k_v^2} n_{p,\sigma} + \sum_{\substack{(p,\sigma) \neq (q,\sigma') \\ v \neq 0}} \frac{2\pi \cos(k_v \cdot r_p - k_v \cdot r_q)}{\Omega k_v^2} n_{p,\sigma} n_{q,\sigma'} \quad (1)$$

In equation (1), N represents the number of spin-orbitals in the system of electrons, $\Omega$ represents the computational cell volume, d represents the number of spatial dimensions (e.g., d=3), $a_{p,\sigma}^\dagger$, $a_{p,\sigma}$ represent fermionic creation and annihilation operators for spin orbital $\phi_{p,\sigma}$, $$p \in \left[-\left(\frac{N}{4}\right)^{\frac{1}{d}}, \left(\frac{N}{4}\right)^{\frac{1}{d}}\right]^d$$

represents a vector indexing the spatial orbitals with $\sigma \in \{\uparrow, \downarrow\}$ encoding spin, $n_{p,q} = a_{p,\sigma}^\dagger a_{p,\sigma}$ represents the number operator for the corresponding spin orbital, $$r_p = p\left(\frac{2\Omega}{N}\right)^{\frac{1}{d}},$$

$$k_v = 2\pi v / \Omega^{1/d} \text{ with } v \in \left[-\left(\frac{N}{4}\right)^{\frac{1}{d}}, \left(\frac{N}{4}\right)^{\frac{1}{d}}\right]^d,$$

and $R_j$ and $\zeta_j$ represent the position and charge of the j-th nucleus, respectively.

Equation (1) above may be mapped to a system of spins under the Jordan-Wigner transform, resulting in a qubit Hamiltonian given by equation (2) below.

$$H = \sum_{p,\sigma} V_p Z_{p,\sigma} + \sum_{(p,\sigma) \neq (q,\sigma')} V_{pq} Z_{p,\sigma} Z_{q,\sigma'} + \sum_{p \neq q,\sigma} T_{pq}(X_{p,\sigma} Z_{p+1,\sigma} \ldots Z_{q-1,\sigma} X_{q,\sigma} + Y_{p,\sigma} Z_{p+1,\sigma} \ldots Z_{q-1,\sigma} Y_{q,\sigma}) \quad (2)$$

$$V_p = \sum_{v \neq 0} \left(\frac{\pi}{\Omega k_v^2} - \frac{k_v^2}{4N} + \sum_j \frac{2\pi \zeta_j \cos(k_v \cdot R_j - k_v \cdot r_p)}{\Omega k_v^2}\right)$$

$$V_{pq} = \sum_{v \neq 0} \frac{\pi \cos(k_v \cdot r_p - k_v \cdot r_q)}{2\Omega k_v^2}$$

$$T_{pq} = \sum_v \frac{k_v^2 \cos(k_v \cdot r_p - k_v \cdot r_q)}{4N}$$

In equation (2), $X_{p,\sigma}$, $Y_{p,\sigma}$, $Z_{p,\sigma}$ represent Pauli operators that correspond to spin ½ particles.

Conventional methods for simulating the electronic structure Hamiltonian include methods based on Gaussian molecular orbital encoding or the Fermionic Fast Fourier Transform (FFFT).

For example, to simulate the evolution of the electronic structure Hamiltonian given by equation (1), some conventional techniques simulate single Trotter steps of the qubit Hamiltonian given by equation (2) by (i) applying a fermionic fast Fourier transform (FFFT) in order to switch between the plane dual wave basis, where $n_p n_q$ are diagonal two-qubit operators, and the plane wave basis, where $a_p^\dagger a_q$ are diagonal single qubit operators, and (ii) applying a linear depth swap network which places all qubits adjacent at least once so that the $n_p n_q$ terms can be simulated. Both steps (i) and (ii) are complex and have significant constant overhead.

This specification describes a new approach to simulate the time evolution of the electronic structure Hamiltonian. Fermionic swap gates are used to cycle through different Jordan-Wigner encodings while simultaneously performing time evolution under terms of an electronic structure Hamiltonian describing the system of electrons.

Example Operating Environment

FIG. 1 depicts an example system 100 for performing quantum simulations using fermionic simulation gates. The example system 100 is an example of a system implemented as classical or quantum computer programs on one or more classical computers or quantum computing devices in one or more locations, in which the systems, components, and techniques described below can be implemented.

The system 100 includes quantum hardware 102 in data communication with a classical processor 104. The system 100 may receive as input data representing a system to be simulated, e.g., input data 106. For example, the system may receive data representing an electronic structure Hamiltonian characterizing a system of electrons. An example electronic structure Hamiltonian is given above with reference to equation (1). The system 100 may generate as output data representing results of simulating the system, e.g., output data 108. For example, the system may output data representing properties of a system of electrons.

The system 100 is configured to perform classical computations in combination with quantum computations using the classical processors 104 and the quantum hardware 102.

The classical processors 104 are configured to receive the input data 106 representing a system to be simulated and to process the received input data 106. Processing the received input data may include transforming the data to an alternative form that may be simulated using the quantum hardware 102.

More specifically, as described above, the input data 106 may include data representing an electronic structure Hamiltonian. Typically, electronic structure Hamiltonians are expressed in terms of annihilation and creation operators that act on electron states, as described below with reference to FIG. 3. The classical processors 104 are configured to transform data representing the electronic structure Hamiltonian to be simulated into data representing a qubit Hamiltonian that characterizes a corresponding system of qubits.

To transform the received input data 106 to the alternative form, the classical processors 104 may be configured to apply a mapping that maps annihilation and creation operators to operators that act on qubits. For example, the classical processors 104 may apply the Jordan Wigner transformation to data representing an electronic structure Hamiltonian characterizing a system of electrons to a qubit Hamiltonian characterizing a corresponding system of qubits. The Jordan Wigner transformation is described in more detail below with reference to FIG. 3.

The classical processors 104 may provide data representing a qubit Hamiltonian characterizing a corresponding system of qubits, e.g., transformed input data 106, to the quantum hardware 102.

The quantum hardware 102 includes a quantum system 110, one or more control devices 112 and a circuit generator 114. The quantum hardware 102 is configured to perform a quantum simulation of the system of qubits using the transformed input data 106. That is, the quantum hardware 102 may include or be a quantum simulator. To perform a quantum simulation of the system of qubits using the transformed input data 106, the quantum hardware is configured to generate a quantum circuit representing the qubit Hamiltonian, and apply the generated quantum circuit to the initialized quantum system 110 using the control devices 112. The control devices 112 may then be used to measure the quantum system 110 to determine an output of the quantum simulation of the system of qubits.

Determined outputs of quantum simulations may be provided to the classical processors 104. For example, performing a quantum simulation using the transformed input data may include repeatedly applying the generated quantum circuit to the initialized quantum system to obtain multiple measurement results. The multiple measurement results may be analyzed by the classical processors 104 to determine statistical results of the quantum simulation, e.g., a quantity representing an average measurement result. Alternatively or in addition, determined outputs of quantum simulations may be post processed by the classical processors 104 to extract relevant information. For example, in some cases observables of interest may comprise a linear combination of measured expectation values. In these examples the classical processors 104 may be configured to process the outputs to determine the weightings of the linear combination (which may be dependent on the encoding of the Hamiltonian being simulated).

The quantum system 110 includes a system of qubits 110a. The system of qubits 110a may include qubits that can be efficiently prepared in an initial state and operated on via application of a quantum circuit. The type of physical realizations of qubits included in the quantum system may vary. For example, in some implementations the quantum system 110 may include superconducting qubits, e.g., superconducting charge qubits, superconducting flux qubits or superconducting phase qubits. In other implementations the quantum system 110 may include qubits realized by spins, e.g., electron spins, nuclear spins or atomic spins.

The system of qubits 110a is arranged as a one-dimensional chain with nearest neighbor interactions. In cases where it is advantageous for the qubits to be arranged as a two or three dimensional array, the two or three dimensional array may be constructed using the one dimensional chain (with no intersections of the one dimensional chain) and the techniques described herein can be equally applied.

The control devices 112 include devices configured to operate on the quantum system 110, e.g., the system of qubits 110a. For example, the control devices 112 may include hardware for implementing quantum logic gates in a quantum circuit, e.g., microwave control devices. In addition, the control devices 112 may include hardware for performing measurements on the quantum system 110, e.g., oscillators.

The circuit generator 114 is configured to generate a quantum circuit to be applied to the quantum system 110. The generated quantum circuits depend on the transformed input data.

The qubit Hamiltonian represented by the transformed input data 106 may include three terms—a kinetic energy operator, an interaction term and an external potential. The quantum circuits generated by the circuit generator 114 include quantum circuits that simulate the kinetic energy operator using a fermionic swap network. The fermionic swap network includes multiple layers of fermionic swap gates that act on neighboring qubits, where a fermionic swap gate acting on qubits p and q=p+1 is given by $$f_{swap} = JordanWigner[f_{swap}^{p,q=p+1}] = \begin{pmatrix} 1 & 0 & 0 & 0 \\ 0 & 0 & 1 & 0 \\ 0 & 1 & 0 & 0 \\ 0 & 0 & 0 & -1 \end{pmatrix}.$$

Application of the fermionic swap network included in the quantum circuit generated by the circuit generator 114 maps operators in the qubit Hamiltonian that act on multiple non-adjacent qubits to operators that act on two neighboring qubits. For example, application of the fermionic swap network may map operators in the qubit Hamiltonian of the form $X_p Z_{p+1} Z_{p+2} \ldots Z_{q-1} X_q$ and $Y_p Z_{p+1} Z_{p+2} \ldots Z_{q-1} Y_q$, with $X_p$ representing a Pauli-X operator applied to qubit p, $Y_p$ representing a Pauli-Y operator applied to qubit p, and $Z_p$ representing a Pauli-Z operator applied to qubit p, to operators of the form $X_p X_{p+1}$ and $Y_p Y_{p+1}$. An example fermionic swap network and the action of the fermionic swap gate on a system of qubits is described in more detail below with reference to FIGS. 3-6.

To simulate the operators that act on two neighboring qubits, e.g., operators of the form $X_p X_{p+1}$ and $Y_p Y_{p+1}$, the circuit generator 114 interleaves quantum logic gates for simulating the operators between the layers of the fermionic swap network. The type of quantum logic gates used to simulate the operators in the kinetic energy operator that act on two neighboring qubits are illustrated below with reference to FIG. 2. Using a fermionic swap network to simulate a kinetic energy operator in a qubit Hamiltonian is described in more detail below with reference to FIGS. 3-6.

In implementations where the qubit Hamiltonian includes an interaction term, the quantum circuits generated by the circuit generator 114 include quantum circuits that simulate operators in the interaction term that act on non-adjacent qubits using the fermionic swap network. For example, application of the fermionic swap network included in the quantum circuit generated by the circuit generator 114 may map operators of the form $Z_p Z_q$ to operators of the form $Z_p Z_{p+1}$. To simulate these operators that act on two neighboring qubits, the circuit generator 114 interleaves quantum logic gates used to simulate the operators between the layers of the fermionic swap network. In addition, to simulate operators in the interaction term that act on single qubits, the circuit generator 114 interleaves quantum logic gates used to simulate the single qubit operators between the layers of the fermionic swap network. The type of quantum logic gates used to simulate the operators in the interaction term are illustrated below with reference to FIG. 2. Using a fermionic swap network to simulate an interaction term in a qubit Hamiltonian is described in more detail below with reference to FIGS. 3-6.

In implementations where the qubit Hamiltonian includes an external potential term, the quantum circuits generated by the circuit generator 114 include quantum circuits that simulate single qubit operators included in the external potential by including single qubit rotations in the quantum circuit. The type of quantum logic gates used to simulate the operators in the external potential are illustrated below with reference to FIG. 2. Using a fermionic swap network to simulate an external potential in a qubit Hamiltonian is described in more detail below with reference to FIGS. 3-6.

In some implementations the circuit generator 114 may generate a quantum circuit that includes one or more fermionic simulation gates 114a. A fermionic simulation gate is a quantum logic gate that is configured to approximately simultaneously (i) simulate the evolution of the system of qubits 110a under the operator $X_p X_{p+1} + Y_p Y_{p+1}$ for a time $\phi$, (ii) simulate the evolution of the system of qubits 110a under the operator $Z_p Z_{p+1}$ for a time $\theta$, and (iii) apply a fermionic swap gate to the two modes. A fermionic simulation gate 114a is given by $$\mathcal{F}(\theta, \phi) = \exp\left(-i\left[\frac{\pi}{4}(Z_p + Z_{p+1}) + \left(\phi + \frac{\pi}{4}\right)(X_p X_{p+1} + Y_p Y_{p+1}) + \theta Z_p Z_{p+1} - \frac{\pi}{2}\right]\right).$$

An example quantum circuit for implementing a fermionic simulation gate 114a is illustrated below with reference to FIG. 2.

Figure 2:
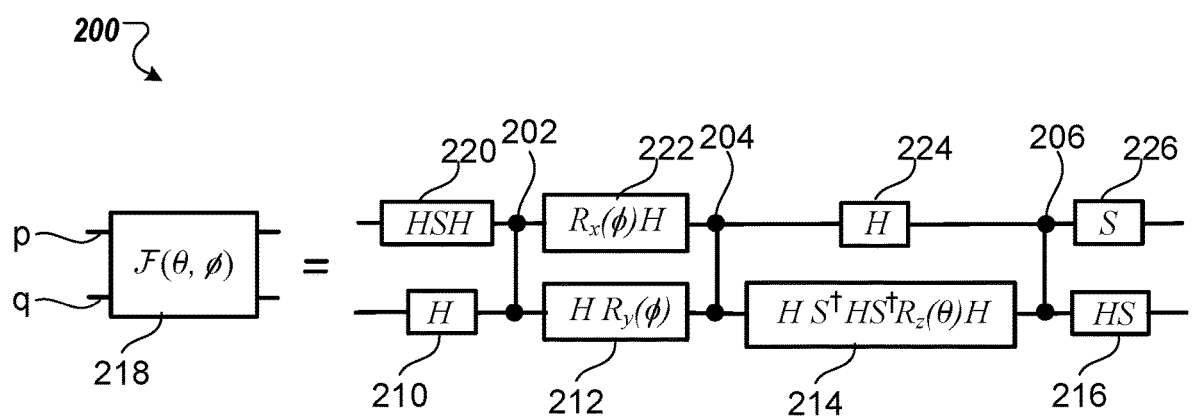
FIG. 2 is a diagram of an example circuit for implementing a fermionic simulation gate.

FIG. 2 is a diagram of an example circuit 200 for implementing a fermionic simulation gate 218. The example circuit 200 is one example realization of a circuit designed to implement a fermionic simulation gate, as described in detail below with reference to FIG. 3. Other realizations may also be used to the same effect. The example circuit 200 is designed to implement a fermionic simulation gate using a transmon superconducting qubit gate library consisting of arbitrary single-qubit rotations and controlled-Z quantum logic gates. However, fermionic simulation gates may be implemented using other qubit gate sets, e.g., corresponding to other qubit realizations.

The fermionic simulation gate 218 is configured to act on two qubits represented by lines p and q. The example circuit 200 for implementing the fermionic simulation gate 218 includes three entangling operations 202, 204 and 206 and seven layers of quantum logic gates. The first layer includes two quantum logic gates 220 and 210. Quantum logic gate 220 acts on the first qubit p and includes a Hadamard gate H followed by a phase gate S followed by a Hadamard gate H. Quantum logic gate 210 acts on the second qubit q and includes a Hadamard gate H.

The second layer includes a first entangling operation 202. The third layer includes two quantum logic gates 222 and 212. Quantum logic gate 222 acts on the first qubit p and includes a rotation gate $R_x(\phi)$ followed by a Hadamard gate H. Quantum logic gate 212 acts on the second qubit q and includes a Hadamard gate H followed by a rotation gate $R_y(\phi)$.

The fourth layer includes a second entangling operation 204. The fifth layer includes two quantum logic gates 224 and 214. Quantum logic gate 224 acts on the first qubit p and includes a Hadamard quantum logic gate H. Quantum logic gate 214 acts on the second qubit q and includes a Hadamard gate H followed by the Hermitian conjugate of a phase gate S, followed by a Hadamard gate H, followed by the Hermitian conjugate of a phase gate S, followed by a rotation gate $R_z(\phi)$ followed by a Hadamard gate H.

The sixth layer includes a third entangling operation 206. The seventh layer includes two quantum logic gates 226 and 216. Quantum logic gate 226 acts on the first qubit p and includes a phase gate. Quantum logic gate 216 acts on the second qubit q and includes a Hadamard gate H and a phase gate S.

In cases where the circuit 200 is repeated, the circuit 200 may include six layers of quantum logic gates since single qubit rotations at the end of one circuit and at the beginning of a subsequent circuit can be combined into one rotation operation.

Using example circuit 200, the total gate depth of implementing one Trotter step of evolution may be N layers of example circuit 200. This may total to a circuit depth of 6N+1, since single qubit gates required to simulate single qubit terms in an external potential term and interaction term of a qubit Hamiltonian can be grouped together as a single gate and interleaved between each layer.

For example, using the systems and methods described in this specification, to simulate a spinless Hamiltonian on a cube with side length 4, e.g., N=64 and d=3 dimensions, a Trotter step of evolution may be only 6×64+1=385 gates deep. In some implementations this may provide a number of gates an order of magnitude shallower than the number of gates required using other methods and systems for simulating electronic structure Hamiltonians, e.g. those that require 5221 layers. This number of gates may be within reach of near-term quantum computers and much smaller than previous estimates of the gate depth of other quantum simulation applications—while also being suitable for a linear nearest-neighbor qubit connectivity.

Programming the Hardware

Figure 3:
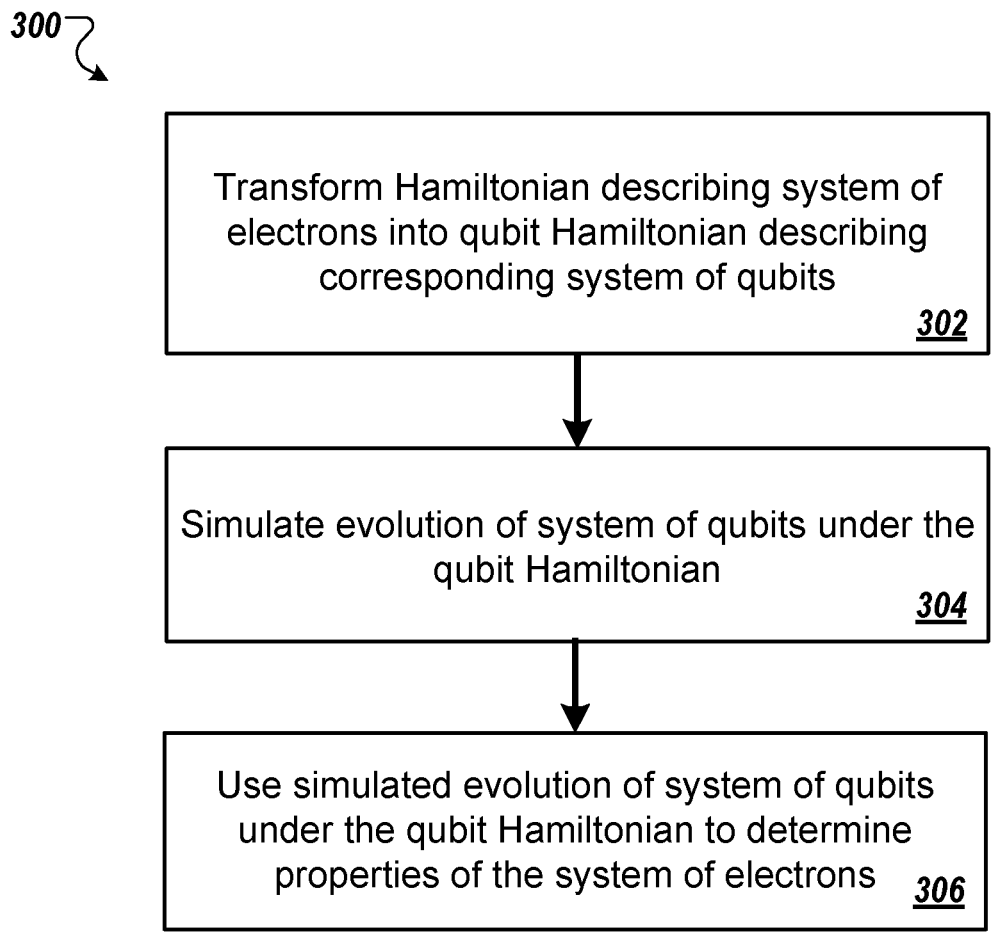
FIG. 3 is a flow diagram of an example process for simulating a system of electrons.

FIG. 3 is a flowchart of an example process 300 for simulating a system of electrons. For convenience, the process 300 will be described as being performed by a system of one or more classical or quantum computing devices located in one or more locations. For example, a quantum computation device, e.g., the system 100 of FIG. 1, appropriately programmed in accordance with this specification, can perform the process 300.

The system transforms a Hamiltonian describing the system of electrons into a qubit Hamiltonian describing a corresponding system of qubits (step 302). Transforming the Hamiltonian describing the system of electrons into a qubit Hamiltonian describing a corresponding system of qubits enables the system to perform a quantum simulation —construct a quantum circuit representing the Hamiltonian describing the system of qubits, apply the quantum circuit to the system of qubits, and perform measurements to determine properties about the action of the qubit Hamiltonian on the system of qubits, and in turn the action of the electronic Hamiltonian on the system of electrons.

The Hamiltonian describing the system of electrons may be an electronic structure Hamiltonian in second quantized form. For example, the Hamiltonian may include one or more terms where each term comprises fermionic annihilation and creation operators $a_{p,\sigma}^\dagger$ and $a_{p,\sigma}$ that obey Fermionic anti-commutation relations and describe the action of removing or adding an electron into spin-orbital $\phi_{p,\sigma}$, where p represents a vector indexing the spatial orbitals of the system of electrons and $\sigma$ encodes electron spin.

The Hamiltonian describing the system of electrons may include a kinetic energy operator, an interaction term and an external potential. For example, as described above with reference to equation (1), the Hamiltonian describing the system of electrons may be given in the plane wave dual basis representation by $$H_{electron} = T + U + V,$$

where the kinetic energy operator is given by $$T = \sum_{p,q,\sigma,v} \frac{k_v^2 \cos(k_v \cdot r_q - k_v \cdot r_p)}{2N} a_{p,\sigma}^\dagger a_{q,\sigma}, \quad (3)$$

the interaction term is given by $$U = \sum_{(p,\sigma) \neq (q,\sigma'), v \neq 0} \frac{2\pi \cos(k_v \cdot r_q - k_v \cdot r_q)}{\Omega k_v^2} n_{p,\sigma} n_{q,\sigma'}, \quad (4)$$

and the external potential is given by $$V = -\sum_{p,\sigma,j,v \neq 0} \frac{4\pi \xi_j \cos(k_v \cdot R_j - k_v \cdot r_p)}{\Omega k_v^2} n_{p,\sigma} \quad (5)$$

where N represents the number of spin-orbitals in the system of electrons, $\Omega$ represents computational cell volume, d represents the number of spatial dimensions (e.g., d=3), $n_{p,q} = a_{p,\sigma}^\dagger a_{p,\sigma}$ represents a number operator for a corresponding spin orbital, $$r_p = p\left(\frac{2\Omega}{N}\right)^{\frac{1}{d}},$$

$$k_v = 2\pi v / \Omega^{1/d} \text{ with } v \in \left[-\left(\frac{N}{4}\right)^{\frac{1}{d}}, \left(\frac{N}{4}\right)^{\frac{1}{d}}\right]^d,$$

and $R_j$ and $\xi_j$ represent the position and charge of the j-th nucleus, respectively.

To transform the Hamiltonian describing the system of electrons into a qubit Hamiltonian describing a corresponding system of qubits, the system may apply a transformation that expresses fermionic operators in terms of operators that act on qubits, e.g., quantum logic gates. For example, the system may apply the Jordan-Wigner transformation to transform fermionic annihilation and creation operators $a_{p,\sigma}^\dagger$ and $a_{p,\sigma}$ to Pauli operators $X_{p,\sigma}$, $Y_{p,\sigma}$, $Z_{p,\sigma}$ that correspond to spin ½ particles. The standard form of the Jordan-Wigner transformation is given below in equation (6).

$$a_p^\dagger \to \frac{1}{2}(X_p - iY_p)Z_{p-1} \cdots Z_1 \; a_p \to \frac{1}{2}(X_p + iY_p)Z_{p-1} \cdots Z_1 \quad (6)$$

Under the Jordan-Wigner transform, the transformed fermionic operators depend on an ordering of the spin orbitals as the action of a fermionic creation or annihilation operator depends on the occupancies of all orbitals with a lower index. This ordering of the orbitals is referred to as the canonical ordering.

The qubit Hamiltonian describing the system of qubits may include a kinetic energy operator, an interaction term, and an external potential. For example, the qubit Hamiltonian may include a transformed kinetic energy operator comprising operators that act on qubits which corresponds to the kinetic energy operator comprising fermionic operators given above in equation (2). Similarly, the qubit Hamiltonian may include a transformed interaction term and a transformed external potential. More specifically, as described above with reference to equation (2), the Hamiltonian describing the system of qubits may be a transformation of an electronic structure Hamiltonian and given by $$H_{qubit} = T + U + V$$

where the kinetic energy operator is given by $$T = \sum_{p \neq q, \sigma} T_{pq}(X_{p,\sigma} Z_{p+1,\sigma} \cdots Z_{q-1,\sigma} X_{q,\sigma} + Y_{p,\sigma} Z_{p+1,\sigma} \cdots Z_{q-1,\sigma} Y_{q,\sigma}) \quad (7)$$

$$\text{with } T_{pq} = \sum_v \frac{k_v^2 \cos(k_v \cdot r_p - k_v \cdot r_q)}{4N},$$

the interaction term is given by $$U = \sum_{(p,\sigma) \neq (q\sigma')} V_{pq} Z_{p,\sigma} Z_{q,\sigma}, \quad (8)$$

$$\text{with } V_{pq} = \sum_{v \neq 0} \frac{\pi \cos(k_v \cdot r_p - k_v \cdot r_q)}{2\Omega k_v^2},$$

and the external potential is given by $$V = \sum_{p,\sigma} V_p Z_{p,\sigma} \quad (9)$$

$$\text{with } V_p = \sum_{v \neq 0} \frac{\pi}{\Omega k_v^2} - \frac{k_v^2}{4N} + \sum_j \frac{2\pi \xi_j \cos(k_v \cdot R_j - k_v \cdot r_p)}{\Omega k_v^2}.$$

In some implementations the system of qubits includes a number of qubits that interact via linear nearest neighbor couplings, e.g., a one-dimensional spin chain. In some implementations the linear chain of qubits may be arranged in the form of a planar lattice or cubic lattice.

The system simulates the evolution of the corresponding system of qubits under the qubit Hamiltonian (step 304). Simulating the evolution of the system of qubits under the qubit Hamiltonian may include preparing the system of qubits in an initial state, constructing a quantum circuit that represents the qubit Hamiltonian and applying the constructed quantum circuit to the initial state of the system of qubits. In some cases preparing the system of qubits in an initial state may include preparing the system of qubits in a product state in the plane wave basis, e.g., in cases where the electronic structure Hamiltonian represents a Hamiltonian of the uniform electron gas jellium. Generally, the type of the initial state depends on the Hamiltonian to be simulated.

Simulating the evolution of the corresponding system of qubits under the qubit Hamiltonian includes simulating the system of qubits under the action of the transformed kinetic energy operator. For example, in cases where the Hamiltonian describing the system of electrons is given by equation (1) and the qubit Hamiltonian describing the corresponding system of qubits is given by equation (2), simulating the evolution of the system of qubits includes simulating the evolution of the system of qubits under the action of the transformed kinetic energy operator given by equation (7) above, e.g., under the action of operators that act on multiple non-adjacent qubits given by $$X_p Z_{p+1} Z_{p+2} \ldots Z_{q-1} X_q \text{ and } Y_p Z_{p+1} Z_{p+2} \ldots Z_{q-1} Y_q$$

with $X_p$ representing a Pauli-X operator applied to qubit p, $Y_p$ representing a Pauli-Y operator applied to qubit p, and $Z_p$ representing a Pauli-Z operator applied to qubit p. Simulating the evolution of a system of qubits under such operators is challenging.

Therefore, to simulate the system of qubits under the transformed kinetic energy operator, the system applies a quantum circuit that cycles through different encodings used to map the electronic structure Hamiltonian to the qubit Hamiltonian, e.g., Jordan-Wigner encodings, whilst performing evolution under terms of the qubit Hamiltonian.

The quantum circuit includes a fermionic swap network. The fermionic swap network is a network of quantum logic gates that includes multiple layers of fermionic swap gates. A fermionic swap gate is a quantum logic gate that is applied to two qubits, e.g., qubits p and q. For example, the fermionic swap gate may be given by $f_{swap}$=JordanWigner$[f_{swap}^{p,q}]$ where JordanWigner$[f_{swap}^{p,q}]$ represents a Jordan-Wigner transformation of the fermionic swap operation $f_{swap}^{p,q}$ operating on qubits p and q. The fermionic swap operation $f_{swap}^{p,q}$ is defined independently of the Jordan-Wigner transformation by $$f_{swap}^{p,q} = 1 + a_p^\dagger a_q + a_q^\dagger a_p - a_p^\dagger a_p - a_q^\dagger a_q. \quad (10)$$

The fermionic swap operation exchanges orbitals p and q while maintaining proper anti-symmetrization $f_{swap}^{p,q} a_p^\dagger (f_{swap}^{p,q})^\dagger = a_q^\dagger$. Therefore, the fermionic swap operation changes the canonical ordering of the qubits, thus altering which fermionic operators are represented by the available two-qubit operators included in the qubit Hamiltonian.

Since terms of the form $n_p n_q$ in a Hamiltonian describing a system of electrons are 2-local, the locality of terms of the form $a_p^\dagger a_q$ is equal to the difference in the canonical ordering index of p and q. The fermionic swap gates included in the fermionic swap network may therefore include fermionic swap gates that are configured to be applied to neighboring qubits p and q=p+1 under the Jordan-Wigner transform. An example fermionic swap gate that is configured to be applied to neighboring qubits p and q=p+1 is given by $$f_{swap} = JordanWigner[f_{swap}^{p,q=p+1}] = \begin{pmatrix} 1 & 0 & 0 & 0 \\ 0 & 0 & 1 & 0 \\ 0 & 1 & 0 & 0 \\ 0 & 0 & 0 & -1 \end{pmatrix} \quad (10)$$

The system sequentially applies each of the multiple layers of fermionic swap gates in the fermionic swap network to the system of qubits to change the canonical ordering of the qubits until the canonical ordering is reversed and each index has been adjacent to all others once. An example sequential application of multiple layers of fermionic swap gates is illustrated below with reference to FIG. 5.

Changing the canonical ordering via the fermionic swap network alters which fermionic operators are represented by the two-qubit operators in the qubit Hamiltonian. In particular, the fermionic swap network is constructed in such a way that each orbital is adjacent to each other orbital in the canonical ordering at some point in the swap network. Then, at that point in the swap network the fermionic operators which previously mapped to operators that act on multiple non-adjacent qubits under the transformation described with reference to step 302, e.g., $X_p Z_{p+1} Z_{p+2} \ldots Z_{q-1} X_q$ and $Y_p Z_{p+1} Z_{p+2} \ldots Z_{q-1} Y_q$, become operators that act on two neighboring qubits, e.g., $X_p X_{p+1}$ and $Y_p Y_{p+1}$.

The evolution of the system of qubits under the transformed kinetic energy operator may therefore be simulated by interleaving gates for simulating the evolution of the system of qubits under the operators that act on two neighboring qubits, e.g., $X_p X_{p+1}$ and $Y_p Y_{p+1}$, between the layers of the fermionic swap network in the quantum circuit.

Simulating the evolution of the system of qubits under the qubit Hamiltonian may further include simulating the system of qubits under the action of the transformed interaction term. For example, in cases where the Hamiltonian describing the system of electrons is given by equation (1) and the qubit Hamiltonian describing the corresponding system of qubits is given by equation (2), simulating the evolution of the system of qubits includes simulating the evolution of the system of qubits under the action of the transformed interaction term given by equation (8) above, e.g., under the action of operators that act on multiple non-adjacent qubits given by $$Z_{p,\sigma} Z_{q,\sigma} \, p \neq q$$

with $Z_p$ representing a Pauli-Z operator applied to qubit p.

The evolution of the system of qubits under the transformed interaction term may also be simulated using the fermionic swap network. As described above, the fermionic swap network is constructed in such a way that each orbital is adjacent to each other orbital in the canonical ordering at some point in the swap network. Then, at that point in the swap network the fermionic operators which previously mapped to operators that act on multiple non-adjacent qubits under the transformation described with reference to step 302, e.g., $Z_{p,\sigma} Z_{q,\sigma}$, for p≠q, become operators that act on single qubits or two neighboring qubits, e.g., (II–$Z_p$–$Z_{p+1}$+$Z_p Z_{p+1}$).

The evolution of the system of qubits under the transformed interaction term may therefore be simulated by interleaving gates for simulating the evolution of the system of qubits under the operators $Z_p Z_{p+1}$, between the layers of the fermionic swap network in the quantum circuit.

In some implementations the quantum circuit constructed by the system to simulate the evolution of the system of qubits under the qubit Hamiltonian includes a network of fermionic simulation gates. A fermionic simulation gate is a quantum logic gate that is configured to approximately simultaneously (i) simulate the evolution of the system of qubits under two qubit operators $X_p X_{p+1}$+$Y_p Y_{p+1}$ for a time $\phi$, (ii) simulate evolution of the system of qubits under the two qubit operator $Z_p Z_{P+1}$ for a time $\psi$, and (iii) apply a fermionic swap gate to the two modes p and q=p+1. The fermionic simulation gate may be given by $$\mathcal{F}(\theta, \phi) = \begin{pmatrix} e^{-i\theta} & 0 & 0 & 0 \\ 0 & -ie^{i\theta}\sin 2\phi & e^{i\theta}\cos 2\phi & 0 \\ 0 & e^{i\theta}\cos 2\phi & -ie^{i\theta}\sin 2\phi & 0 \\ 0 & 0 & 0 & -e^{-i\theta} \end{pmatrix} = \exp\Bigl($$

-continued $$-i\left[\frac{\pi}{4}(Z_p + Z_{p+1}) + \left(\phi + \frac{\pi}{4}\right)(X_p X_{p+1} + Y_p Y_{p+1}) + \theta Z_p Z_{p+1} - \frac{\pi}{2}\right]\right].$$

In some implementations $$\binom{N}{2}$$

fermionic simulation gates may be sufficient to implement a Trotter step of evolution under the qubit Hamiltonian, where N represents the number of orbitals in the system of electrons and the number of qubits in the system of qubits.

When the fermionic simulation gate $F(\theta, \phi)$ acts on adjacent qubits corresponding to spin orbitals $\psi_{p,\sigma}$ and $\phi_{q,\sigma}$, $\phi=2\delta_{\sigma,\sigma'}T_{pq}$ and $\psi=2V_{pq}$ where $T_{pq}$ and $V_{pq}$ are defined above with reference to equations (7) and (8), respectively.

To simulate the single qubit operators included in the interaction term, the system may further include appropriate single qubit rotations in the quantum circuit. For example, the system may include rotations about the Z axis of the Bloch sphere by $2V_p$, where $V_p$ is defined above with reference to equation (2), at any point in the quantum circuit.

Simulating the evolution of the system of qubits under the qubit Hamiltonian may further include simulating the system of qubits under the action of the transformed external potential. For example, in cases where the Hamiltonian describing the system of electrons is given by equation (1) and the qubit Hamiltonian describing the corresponding system of qubits is given by equation (2), simulating the evolution of the system of qubits includes simulating the evolution of the system of qubits under the action of the transformed external potential given by equation (9) above, e.g., under the action of operators that act on single qubits given by $Z_p$.

In these implementations the system may simulate such single qubit operators by including appropriate single qubit rotations in the quantum circuit. For example, the system may include rotations about the Z axis of the Bloch sphere by $2V_p$, where $V_p$ is defined above with reference to equation (2), at any point in the quantum circuit.

The system uses the simulated evolution of the system of qubits under the qubit Hamiltonian to determine properties of the system of electrons (step 306). For example, in cases where the system of electrons to be simulated represent a chemical or a material, using the simulated evolution of the system of qubits under the qubit Hamiltonian to determine properties of the system of electrons may include using the simulated evolution of the system of qubits under the qubit Hamiltonian to determine properties of the chemical or material, e.g., the conductance of a metal, chemical dynamics, elastic moduli, energy, dipole moment, or optical properties.

Figure 4:
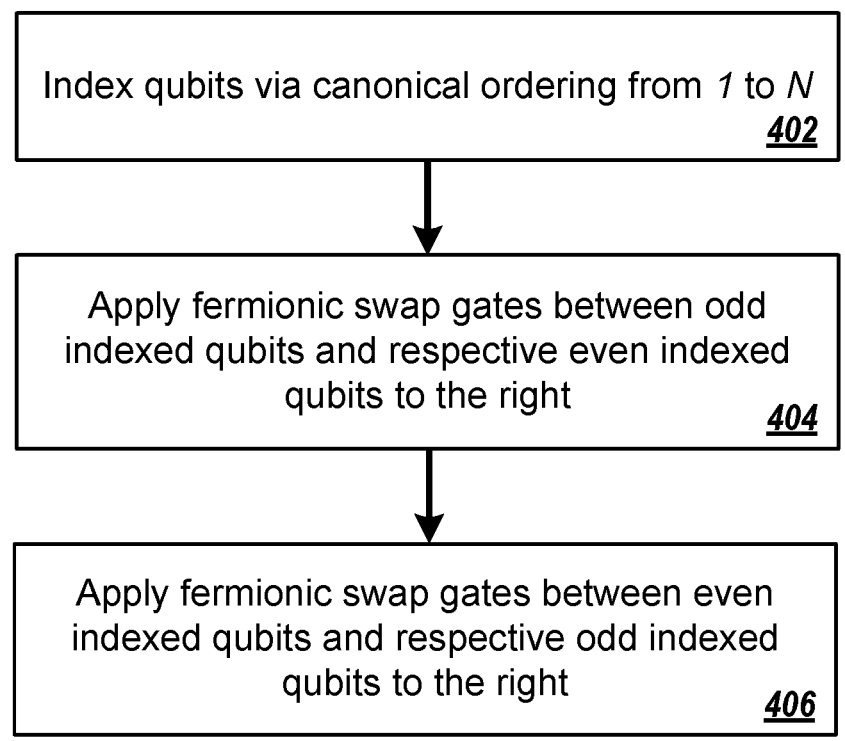
FIG. 4 is a flow diagram of an example application of a fermionic swap network.

FIG. 4 is a flow diagram of an example application of a fermionic swap network. For convenience, the process 400 will be described as being performed by a system of one or more classical or quantum computing devices located in one or more locations. For example, a quantum computation system, e.g., the system 100 of FIG. 1, appropriately programmed in accordance with this specification, can perform the process 400.

The system indexes the qubits using the Jordan-Wigner canonical ordering from 1 to N (step 402). For example, in cases where the qubits are arranged in a linear array, i.e., a line, a first qubit in the linear array may correspond to index i=1 and a last qubit in the linear array may correspond to index i=N.

The system sequentially applies fermionic swap gates between odd numbered qubits and even numbered qubits to the right (step 404) and fermionic swap gates between even numbered qubits and odd numbered qubits to the right (step 406).

More specifically, the system alternately applies (1) fermionic swap gates between odd qubits 2i+1 and even qubits to their right 2i+2 for i∈[0, (N−2)/2], and (2) even qubits 2i+2 and odd qubits to their right 2i+3 for i∈[0, (N−2)/2]. At each application of stage (1), the last qubit in the indexed line of qubits is untouched for odd N, e.g., as is the case for a spinless Hamiltonian, because there is no even numbered qubit to its right. At each application of stage (2), the first qubit in the indexed line of qubits is untouched for N even or odd because there is no qubit on its left. The last qubit is also untouched for even N.

The system sequentially applies the fermionic swap gates until the canonical ordering of the qubits is reversed. Example canonical ordering changes through five layers of fermionic swap gates are illustrated below with reference to FIG. 5.

Figure 5:
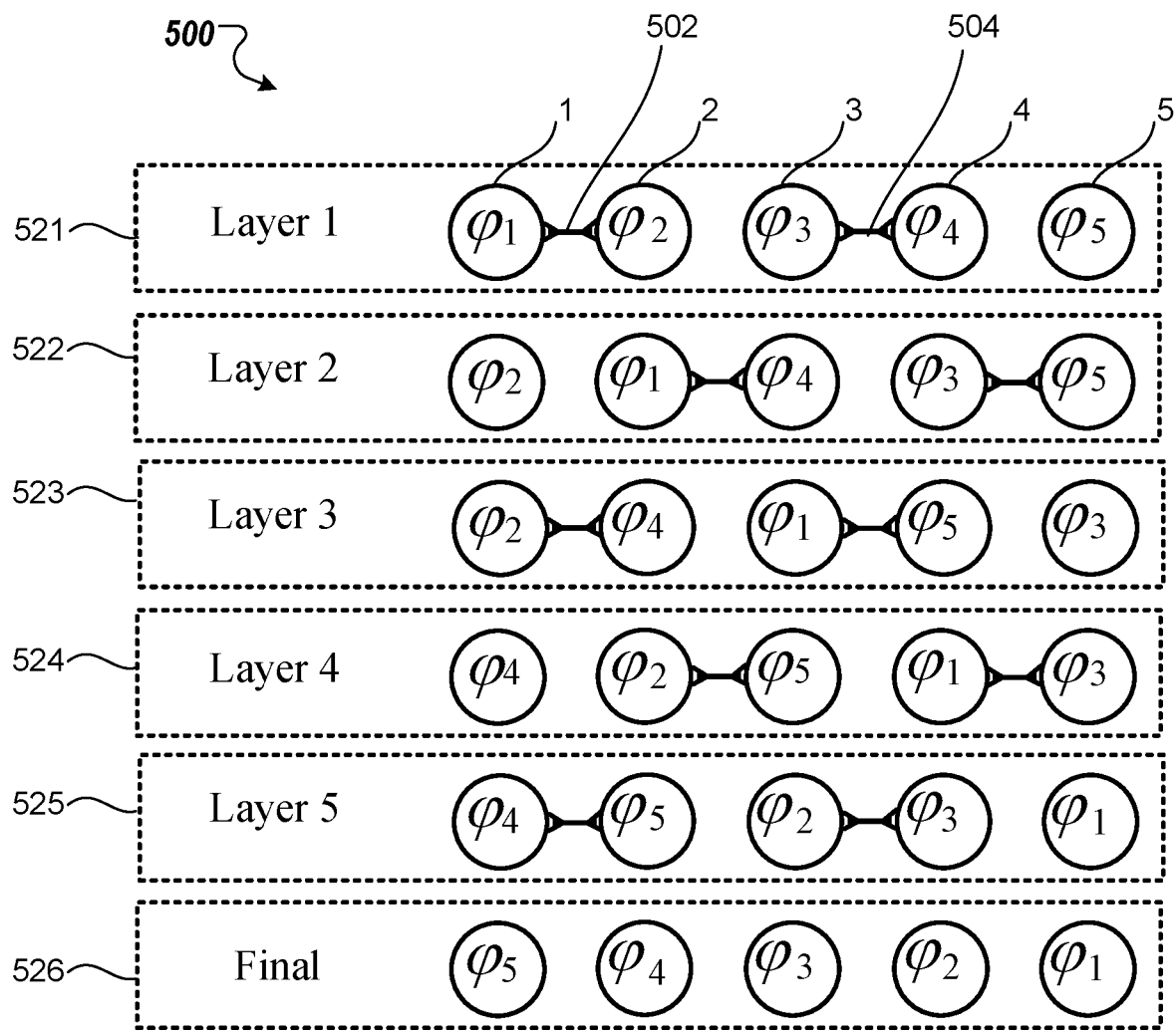
FIG. 5 is a diagram of an example application of fermionic swap gates in a fermionic swap network.

FIG. 5 is a diagram 500 of an example application of fermionic swap gates in a fermionic swap network. For convenience, the diagram 500 shows an example application of fermionic swap gates in a fermionic swap network with N=5 layers (that are each configured to be applied to N=5 qubits). However, the number of layers (and qubits) included in the fermionic swap network is dependent on the number of spin orbitals in the system of electrons that is to be simulated and may therefore vary.

The diagram 500 shows how the canonical ordering of five qubits may be updated through the application of a fermionic swap network that includes five layers 521-525. Each circle 1-5 represents a qubit in a linear array. The qubits do not move—the $\psi_p$ inside each circle represents which spin-orbital occupancy is encoded by the respective qubit during a particular fermionic swap network layer. For example, at layer 521 qubit 1 encodes spin-orbital occupancy $\psi_1$, at layers 522 and 523 qubit 1 encodes spin-orbital occupancy $\psi_2$, at layers 525 qubit 1 encodes spin-orbital occupancy $\psi_4$ and at the final layer 526 qubit 1 encoders spin-orbital occupancy $\psi_5$.

The lines between qubits, e.g., line 502 between qubits 1 and 2 (hereafter denoted as (1, 2)) and line 504 between qubits (3, 4), represent fermionic swap gates, as described above in equation (10), which change the canonical ordering of the linear array of qubits so that different spin-orbital occupancies are represented by different qubits in a subsequent layer.

In the first layer 521 of the fermionic swap network, the one-dimensional chain of qubits 1-5 are indexed according to an example canonical ordering $\psi_1$, $\psi_2$, $\psi_3$, $\psi_4$, $\psi_5$. The system then applies fermionic swap gates 502 and 504 between qubits (1, 2) and (3, 4) respectively. This application of fermionic swap gates results in an updated canonical ordering $\psi_2$, $\psi_1$, $\psi_4$, $\psi_3$, $\psi_5$.

In the second layer 522 of the fermionic swap network, the system applies fermionic swap gates between qubits (1, 4) and (3, 5). This application of fermionic swap gates results in an updated canonical ordering $\psi_2$, $\psi_4$, $\psi_1$, $\psi_5$, $\psi_3$.

In the third layer 523 of the fermionic swap network, the system applies fermionic swap gates between qubits (2, 4) and (1, 5). This application of fermionic swap gates results in an updated canonical ordering $\psi_4$, $\psi_2$, $\psi_5$, $\psi_1$, $\psi_3$.

In the fourth layer 524 of the fermionic swap network, the system applies fermionic swap gates between qubits (2, 5) and (1, 3). This application of fermionic swap gates results in an updated canonical ordering $\psi_4, \psi_5, \psi_2, \psi_3, \psi_1$.

In the fifth layer of the fermionic swap network, the system applies fermionic swap gates between qubits (4, 5) and (2, 3). This application of fermionic swap gates results in an updated canonical ordering $\psi_5, \psi_4, \psi_3, \psi_2, \psi_1$ that is a reverse of the canonical ordering $\psi_1, \psi_2, \psi_3, \psi_4, \psi_5$, as shown in the final row 526.

The total number of sequential applications of fermionic swap gates, i.e., the total number of layers of fermionic swap gates applied to the system of qubits is N=5, where N represents the number of qubits in the system of qubits (and the number of spin-orbitals in the system of electrons to which the system of qubits corresponds to).

FIG. 6 is a table 600 showing an example mapping of qubit operators to kinetic energy operator terms at the multiple layers of fermionic swap gates described above with reference to FIG. 5. For example, rows 604-612 of table 600 correspond to layers 521-525, respectively, of diagram 500 with reference to FIG. 5.

The entries of the first column 602 of table 600 indicates which pairs of qubits are involved in respective fermionic swaps gates. For example, in row 604 of table 600, column 614 indicates that in the first layer 521 of FIG. 5, fermionic swap gates are applied to qubits 1 and 2 encoding spin-orbital occupancy $\psi_1$ and $\psi_2$, respectively and to qubits 3 and 4 encoding spin-orbital occupancy $\psi_3$ and $\psi_4$, respectively. As another example, in row 606 of table 600, column 614 indicates that in the second layer 522 of FIG. 5, fermionic swap gates are applied to qubits 2 and 3 encoding spin-orbital occupancy $\psi_1$ and $\psi_4$, respectively and to qubits 4 and 5 encoding spin-orbital occupancy $\psi_3$ and $\psi_5$, respectively.

The entries of columns 614, 616, 618 and 620 indicate which kinetic energy fermionic operators $a_p^\dagger, a_p$ the qubit operators $X_p, Y_p$ correspond to at each layer. For example, the entry corresponding to row 604 and column 614 indicates that the qubit operators ½ $(X_1X_2+Y_1Y_2)$ correspond to kinetic energy fermionic operators $a_1^\dagger a_2+a_2^\dagger a_1$ at layer 521 in diagram 500 of FIG. 5. As another example, the entry corresponding to row 606 and column 616 indicates that the qubit operators ½ $(X_2X_3+Y_2Y_3)$ correspond to kinetic energy fermionic operators $a_1^\dagger a_4+a_4^\dagger a_1$ at layer 522 in diagram 500 of FIG. 5.

Table 600 shows that, as described above with reference to step 304 of FIG. 3, $$\binom{N}{2} = \binom{5}{2} = 10$$

possible kinetic energy interactions appear in the table (since diagonal lines through entries of the table indicate that the pair of qubits is not acted on in that layer) and are this applied during application of the fermionic swap network. Since the fermionic simulation gate described above with reference to FIG. 3 also applies the potential energy interactions during application of the fermionic swap network, the five layers 521-525 represented by rows 604-612 may implement an entire Trotter step of evolution.

In addition to the simulation of electronic structures, the methods and systems described in this specification may be applied to various other settings and tasks. For example, quantum circuits that include fermionic simulation gates can be applied to the 2D Hubbard model to simulate Trotter steps in $O(\sqrt{N})$ depth on a linear array of qubits, as described in detail below with reference to FIGS. 7-9.

As another example, quantum circuits that include fermionic simulation gates can be used to form a quantum variational algorithm based on Trotter steps. For example, the fermionic simulation gate schemes described herein may be used to apply Trotter steps to a quantum state of a quantum system, resulting in a quantum state that is a variational approximation to a quantum state of interest. The energy (or another observable) of the quantum system can then be measured and used to adjust system parameters to minimize the energy of the quantum system. In some cases such a variational algorithm may be implemented on a near term quantum computing device.

As another example, the techniques described in this specification may be used to perform an exact quantum phase estimation algorithm in combination with error correction algorithms, e.g., error corrected quantum simulations. More specifically, the quantum phase estimation algorithm determines a ground state of a quantum system exactly by repeatedly applying a unitary operator to the quantum system. The fermionic simulation gate schemes described herein may be used in combination with Trotterization to approximate the unitary operator.

Figure 7:
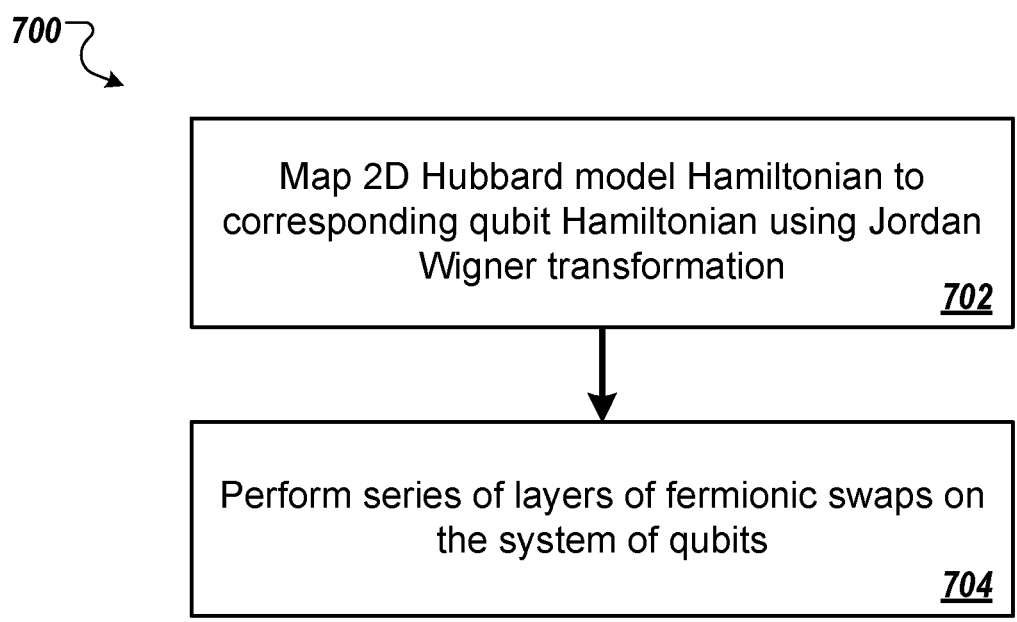
FIG. 7 is a flowchart of an example process for simulating Trotter steps of the 2D Hubbard model.

FIG. 7 is a flowchart of an example process 700 for simulating Trotter steps of the 2D Hubbard model. For convenience, the example process 700 is described as simulating Trotter steps of the 2D Hubbard model with spins, given by $$H = -t \sum_{\langle pq \rangle, \sigma} \left( a_{p,\sigma}^\dagger a_{q,\sigma} + a_{q,\sigma}^\dagger a_{p,\sigma} \right) + U \sum_p n_{p,\uparrow} n_{p,\downarrow}.$$

However, the described process may also be applied to a spinless 2D Hubbard model, e.g., a spinless Hubbard model with an odd number of sites in each row. In addition, the described process may also be applied to 3D models (resulting in $O(N^{2/3})$ gate depth).

The process 700 will be described as being performed by a system of one or more classical or quantum computing devices located in one or more locations. For example, a quantum computation device, e.g., the system 100 of FIG. 1, appropriately programmed in accordance with this specification, can perform the process 700.

The system uses the Jordan-Wigner transformation to map the 2D Hubbard model Hamiltonian with spins to a qubit Hamiltonian characterizing a corresponding system of qubits (step 702). Mapping the 2D Hubbard model Hamiltonian to a qubit Hamiltonian includes choosing a particular ordering of the orbitals for the Jordan Wigner transformation, as illustrated below with reference to FIG. 8.

The system performs a series of fermionic swaps on the system of qubits (step 704). The series of fermionic swaps are illustrated below with reference to FIG. 9.

Figure 8:
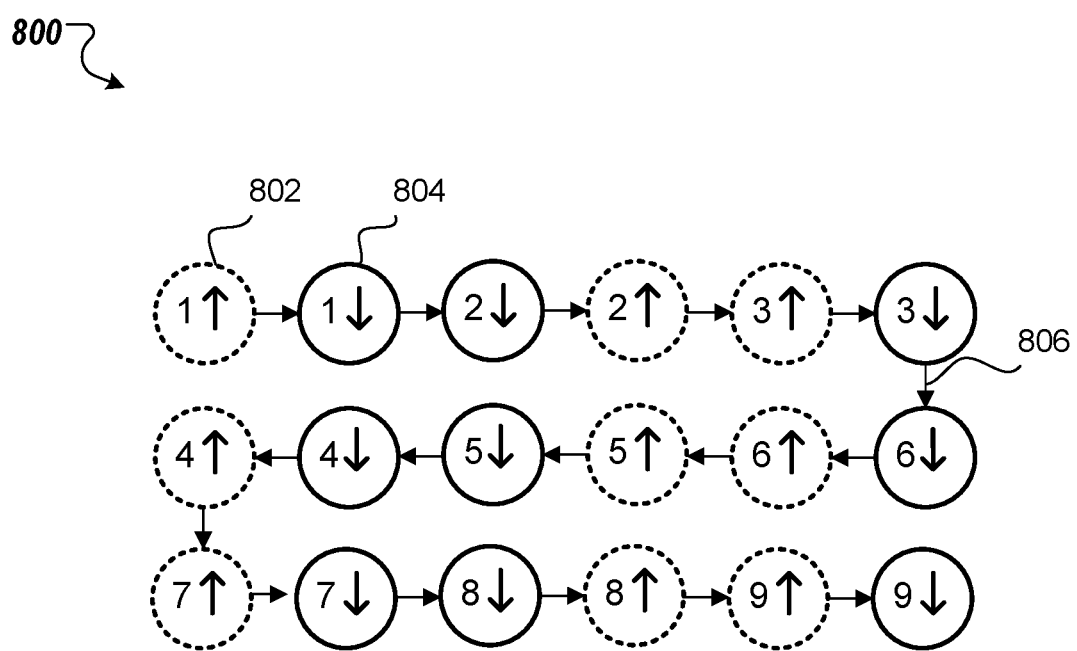
FIG. 8 is an illustration of an example mapping of 2D Hubbard model sites to a linear qubit chain.

FIG. 8 is an illustration 800 of an example mapping of 2D Hubbard model sites to a linear qubit chain. Each circle in illustration 800 represents a spin-orbital. Circles drawn with a dashed line, e.g., circle 802, represents a spin-up orbital. Circles drawn with a solid line, e.g., circle 804, represents a spin-down orbital. Arrows between circles represent the canonical ordering that should be used in the Jordan Wigner transformation. The illustration 800 shows that the canonical ordering includes alternating whether the up or down orbital comes first across the rows and alternating whether to order in ascending or descending across columns.

FIG. 9 is an illustration 900 of two example layers 900a and 900b of fermionic swaps. In both layer 900a and 900b, each circle represents a spin-orbital. Circles drawn with a dashed line, e.g., circle 902, represents a spin-up orbital. Circles drawn with a solid line, e.g., circle 904, represents a spin-down orbital. Arrows between circles, e.g., arrow 906, represent applications of fermionic swap gates.

By repeatedly applying the layers 900a and 900b in a particular way it is possible to bring spin orbitals from adjacent rows next to each other in the canonical ordering so that the hopping term in the Hubbard model Hamiltonian may be applied locally.

Repeatedly applying the layers 900a ($U_L$) and 900b ($U_R$) includes first applying $U_L$. This enables application of the remaining horizontal hopping term that could not be previously reached. Then, $U_R U_L$ is repeatedly applied. After each application of $U_R U_L$ new vertical hopping terms become available until $U_R U_L$ has been applied a total of $\sqrt{N/8}-1$ times, with N representing the number of qubits in the system of qubits. At this point, the series of swaps needs to be reversed until the orbitals are back to their original locations in the canonical ordering. At this point, applying $U_R U_L$ causes the qubits to circulate in the other direction. The may be repeated for a total of $\sqrt{N/8}-1$ times to ensure that all neighboring orbitals are adjacent at least once. The total number of layers of fermionic swaps required for the whole procedure is $\sqrt{9N/2}$.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for simulating a physical system, the method comprising:
  transforming a Hamiltonian describing the physical system into a qubit Hamiltonian describing a corresponding system of qubits, the qubit Hamiltonian comprising a transformed kinetic energy operator;
  simulating evolution of the system of qubits under the qubit Hamiltonian, comprising simulating the evolution of the system of qubits under the transformed kinetic energy operator by applying a fermionic swap network to the system of qubits; and
  using the simulated evolution of the system of qubits under the qubit Hamiltonian to determine properties of the physical system.

2. The method of claim 1, wherein the fermionic swap network comprises a quantum circuit comprising multiple layers of fermionic swap gates.

3. The method of claim 2, wherein transforming the Hamiltonian describing the physical system into the corresponding qubit Hamiltonian comprises applying the Jordan-Wigner transform.

4. The method of claim 3, wherein the qubits in the system of qubits are indexed according to a canonical ordering, and wherein simulating the evolution of the system of qubits under the transformed kinetic energy operator using the fermionic swap network comprises sequentially applying each of the multiple layers of fermionic swap gates to the system of qubits to change the canonical ordering of the qubits until the canonical ordering is reversed and each index has been adjacent to all others once.

5. The method of claim 4, wherein the transformed kinetic energy operator comprises one or more operators that act on multiple non-adjacent qubits and wherein sequentially applying each of the multiple layers of fermionic swap gates to the system of qubits maps the one or more operators that act on multiple non-adjacent qubits to operators that act on two neighboring qubits.

6. The method of claim 5, wherein the one or more operators that act on multiple non-adjacent qubits comprise operators of the form $X_p Z_{p+1} Z_{p+2} \ldots Z_{q-1} X_q$ and $Y_p Z_{p+1} Z_{p+2} \ldots Z_{q-1} Y_q$, with $X_p$ representing a Pauli-X operator applied to qubit p, $Y_p$ representing a Pauli-Y operator applied to qubit p, and $Z_p$ representing a Pauli-Z operator applied to qubit p, and wherein the operators that act on two neighboring qubits comprise operators of the form $X_p X_{p+1}$ and $Y_p Y_{p+1}$.

7. The method of claim 5, wherein simulating the evolution of the system of qubits under the transformed kinetic energy operator using the fermionic swap network further comprises:
interleaving gates for simulating the evolution of the system of qubits under the operators that act on two neighboring qubits between the layers of the fermionic swap network; and
applying the interleaved gates when simulating the evolution of the system of qubits.

8. The method of claim 7, wherein
(i) the qubit Hamiltonian further comprises a transformed interaction term comprising operators that act on non-adjacent qubits in the system of qubits, and
(ii) simulating the evolution of the system of qubits under the qubit Hamiltonian further comprises simulating the evolution of the system of qubits under the transformed interaction term using the fermionic swap network, comprising:
interleaving gates for simulating the evolution of the system of qubits under the operators in the transformed interaction term that act on neighboring qubits between the layers of the fermionic swap network.

9. The method of claim 8, wherein the transformed interaction term comprises operators of the form $(\Pi - Z_p - Z_{p+1} + Z_p Z_{P+1})$ where $Z_p$ represents a Pauli-Z operator applied to qubit p.

10. The method of claim 9, wherein simulating evolution of the system of qubits under the qubit Hamiltonian using the fermionic swap network comprises applying a network of fermionic simulation gates to the system of qubits, the fermionic simulation gates being configured to approximately simultaneously (i) simulate the evolution of the system of qubits under the operator $X_p X_{p+1} + Y_p Y_{p+1}$ for a time $\phi$, (ii) simulate evolution of the system of qubits under the operator $Z_p Z_{P+1}$ for a time $\theta$, and (iii) apply a fermionic swap gate to the two modes p and p+1.

11. The method of claim 10, wherein N choose 2 fermionic simulation gates are sufficient to implement a Trotter step of evolution, where N represents the number of qubits in the system of qubits.

12. The method of claim 10, wherein the fermionic simulation gate is given by $$\mathcal{F}(\theta, \phi) = \exp\left(-i\left[\frac{\pi}{4}(Z_p + Z_{p+1}) + \left(\phi + \frac{\pi}{4}\right)(X_p X_{p+1} + Y_p Y_{p+1}) + \theta Z_p Z_{p+1} - \frac{\pi}{2}\right]\right).$$

13. The method of claim 9, wherein simulating evolution of the system of qubits under the qubit Hamiltonian further comprises applying single qubit rotations to the system of qubits to simulate the single qubit operators in the interaction term.

14. The method of claim 1, wherein
(i) the qubit Hamiltonian further comprises a transformed external potential comprising operators that act on single qubits in the system of qubits, and
(ii) simulating evolution of the system of qubits under the qubit Hamiltonian further comprises simulating the evolution of the system of qubits under the transformed external potential, comprising applying single qubit rotations to the system of qubits.

15. The method of claim 4, wherein sequentially applying each of the multiple layers of fermionic swap gates to the system of qubits to change the canonical ordering of the qubits comprises:
indexing the qubits by the canonical ordering from 1 to N;
sequentially applying:
fermionic swap gates between odd numbered qubits and even numbered qubits to the right; and
fermionic swap gates between even numbered qubits and odd numbered qubits to the right.

16. The method of claim 15, wherein the physical system comprises a system of electrons and wherein the total number of applied layers comprises N applied layers, with N representing the number of orbitals in the system of electrons and the number of qubits in the system of qubits.

17. The method of claim 2, wherein a fermionic swap gate acting on qubit p and qubit q=p+1 is given by $$f_{swap} = JordanWigner[f_{swap}^{p,q}] = \begin{pmatrix} 1 & 0 & 0 & 0 \\ 0 & 0 & 1 & 0 \\ 0 & 1 & 0 & 0 \\ 0 & 0 & 0 & -1 \end{pmatrix}.$$

18. The method of claim 1, wherein the qubit Hamiltonian describes a system of qubits that interact via linear nearest neighbor couplings.

19. The method of claim 1, wherein the physical system comprises a system of electrons.

20. The method of claim 19, wherein the system of electrons represent a chemical or material, and wherein using the simulated evolution of the system of qubits under the qubit Hamiltonian to determine properties of the system of electrons comprises using the simulated evolution of the system of qubits under the qubit Hamiltonian to determined properties of the chemical or material.

21. The method of claim 1, wherein the physical system is described by a two-dimensional Hubbard model.

22. An apparatus comprising:
quantum hardware, comprising:
a plurality of qubits,
a plurality of single qubit gates,
a plurality of two qubit gates;

one or more classical processors;
wherein the apparatus is configured to perform operations comprising:
   transforming, by the classical processors, a Hamiltonian describing a physical system into a qubit Hamiltonian describing a corresponding system of qubits, the qubit Hamiltonian comprising a transformed kinetic energy operator;
   simulating, by the quantum hardware, evolution of the system of qubits under the qubit Hamiltonian, comprising simulating the evolution of the system of qubits under the transformed kinetic energy operator by applying a fermionic swap network to the system of qubits, wherein the fermionic swap network is constructed from the quantum hardware; and
   using the simulated evolution of the system of qubits under the qubit Hamiltonian to determine properties of the physical system.

* * * * *